United States Patent [19]

Lindley

[11] Patent Number: 4,590,147

[45] Date of Patent: May 20, 1986

[54] DRY FILM RESISTS CONTAINING UNSATURATED OLIGOMER

[75] Inventor: Andrew A. Lindley, Warrington, England

[73] Assignee: Imperial Chemical Industries PLC, London, England

[21] Appl. No.: 674,318

[22] Filed: Nov. 23, 1984

[30] Foreign Application Priority Data

Dec. 6, 1983 [GB] United Kingdom ............... 8332519
Jun. 6, 1984 [GB] United Kingdom ............... 8414437

[51] Int. Cl.$^4$ ............................................. G03C 1/68
[52] U.S. Cl. ................................. 430/286; 430/281; 430/287; 430/288; 522/44; 522/121; 528/232; 528/242

[58] Field of Search ............. 430/286, 287, 288, 281; 204/159.11, 159.14, 159.21; 528/232, 242

[56] References Cited

U.S. PATENT DOCUMENTS 3,469,982  9/1969  Coleste ............................... 430/281
3,914,194  10/1975  Smith ................................. 430/281
4,439,291  3/1984  Irving et al. ........................ 430/287

Primary Examiner—Jack P. Brammer
Attorney, Agent, or Firm—Cushman, Darby & Cushman

[57] ABSTRACT

A polymerizable composition comprises a polymerizable olefinically unsaturated aromatic/aldehyde oligomer, a polymeric binder and a photoinitiator system. Such compositions may be used to prepare permanent dry film resists.

11 Claims, No Drawings

DRY FILM RESISTS CONTAINING UNSATURATED OLIGOMER

This invention relates to compositions comprising polymerisable material and photo-initiator systems for the polymerisation thereof, and particularly to such compositions for use as dry film resists.

Dry or tack-free film resists are known in the electronics art, for example as disclosed in U.S. Pat. No. 3,469,982. Typically, such resists are formed from a solid photopolymerisable layer supported on a thin flexible polymeric support film and covered by a protective or cover film.

Recently so-called permanent or non-strippable dry film resists have been developed in which the cured photopolymerisable layer is able to withstand the harsh environments to which resists are subjected during the production of printed circuit boards. Use of permanent dry film resists eliminates one step in the production of printed circuit boards, namely removal of cured resist.

We have now found that certain oligomers in admixture with a suitable photoinitiator system may be used to form dry film resists and particularly permanent dry film resists.

According to the present invention there is provided a polymerisable composition comprising (a) at least one polymerisable olefinically unsaturated oligomer, which may be linear or branched, which (i) comprises the repeating unit ($Ar^1$—$CHR^1$) wherein $Ar^1$ is an aromatic group, or a suitable substituted derivative thereof, each of which aromatic groups in the oligomer backbone may be the same or different, and $R^1$, each of which groups in the oligomer backbone may be the same or different,is hydrogen or a hydrocarbyl group and (ii) has pendant and/or terminal acyloxymethyl groups in which the acyl group is derived from an olefinically unsaturated carboxylic acid (hereinafter referred to for convenience as "aromatic/aldehyde oligomer"), (b) one or more polymeric binders and (c) a photoinitiator system for initiating polymerisation of the at least one aromatic/aldehyde oligomer.

The aromatic groups $Ar^1$ may be mono-nuclear, e.g. as in phenylene; fused polynuclear, e.g. as in naphthalene or anthracene; or preferably have the structure —$\phi$—$Y^1$—$\phi$—. In —$\phi$—$Y^1$—$\phi$—, $\phi$ is the phenylene group and $Y^1$ is a direct link between the two phenylene groups; a divalent residue which contains one or more in-chain atoms, each of which atoms may be carbon or a hetero atom and may have one or more atoms appendant thereto, e.g. —O—, —S—, or —$CH_2$— or a substituted derivative of —$CH_2$—, e.g. —$C(CH_3)_2$—; —$CH_2CH_2$—; or

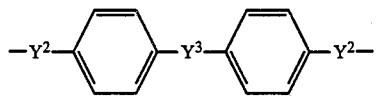

where $Y^2$ each of which may be the same or different, is a group which activates the aromatic nucleus to electrophilic attack, e.g. —O— and —S—, and $Y^3$ is a group which deactivates the aromatic nucleus to electrophilic attack, e.g. —$SO_2$— and —CO—.

Substitutents which may be present on the aromatic groups include inter alia lower alkyl groups having up to five carbon atoms, e.g. methyl and ethyl; lower alkoxy groups e.g. methoxy; and halo groups, e.g. chloro.

$R^1$ in the repeating unit —$AR^1$—$CHR^1$— is preferably hydrogen. We do not exclude the possibility, however, that it may be an aryl group, e.g. phenyl; an alkaryl group, e.g. tolyl; an aralkyl group, e.g. benzyl; or an alkyl group having up to six carbon atoms.

Aromatic/aldehyde oligomers for use in the present invention preferably have functionalities between 2 and 6 and more preferably between 3 and 4. At functionalities less than 2 curing of the polymerisable composition is too slow; at functionalities more than 6 the cured product is often too brittle.

By "functionality" we mean the average number of pendant and terminal groups on each aromatic/aldehyde oligomer molecule.

In aromatic/aldehyde oligomers for use in the present invention in which the aromatic group $Ar^1$ has the structure —$\phi$—$Y^1$—$\phi$—, it is preferred that the ratio of para-para linkages to ortho-para linkages is between 5:1 and 2:1.

By "para-para linkage" we mean a linkage in which —$CHR^1$— groups are attached to both phenylene groups in the residue —$\phi$—$Y^1$—$\phi$— at positions which are para to the linkage joining the —$Y^1$— residue to the phenylene groups.

By "ortho-para linkage" we mean a linkage in which a —$CHR^1$— group is attached to a first phenylene group in the residue —$\phi$—$Y^1$—$\phi$— at a position which is ortho to the position at which the —$Y^1$— residue is attached to that first phenylene group and a —$CHR^1$— group is attached to a second phenylene group in the residue —$\phi$—$Y^1$—$\phi$ at a position which is para to the position at which the —$Y^1$— residue is attached to the second phenylene group.

Aromatic/aldehyde oligomers for use in the present invention preferably have viscosities such that when they are mixed with polymeric binders as hereinafter defined and in the ratios as hereinafter described compositions are obtained which are tack-free and do not flow on storage at room temperature during their useful life.

Aromatic/aldehyde oligomers for use in the present invention preferably have number average molecular weights of between 900 and 1100 and weight average molecular weights of between 1900 and 2500.

Aromatic/aldehyde oligomers for use in the present invention may be prepared under the conditions which are more fully described in U.S. Pat. No. 4,530,992 (the disclosure in which application is incorporated herein by way of reference).

Polymeric binders for use in the present invention are thermoplastics which on addition to solutions of the at least one aromatic/aldehyde oligomer in suitable solvents increase the viscosity of such solutions and tend to reduce the tackiness of solid layers deposited therefrom. They often have molecular weights of between 10,000 and 1,000,000, preferably between 20,000 and 100,000.

It will be appreciated that polymeric binders, for use in the present invention will have Tg's above 20° C., preferably between 50° C. and 120° C., and more preferably about 90° C., good thermal stability and should not unduly adversely affect the rate of polymerisation of the polymerisable composition. Use of polymeric binders having Tg's of about 90° C. often gives polymerisable compositions which flow to form better laminates in the production of three-layer elements as hereinafter described under conventional production conditions of temperature, about 100° C., and rate of throughput.

As examples of suitable polymeric binders may be mentioned interalia polystyrene, polymethyl methacrylate, poly-vinyl acetate, polyvinyl butyral, 'Haloflex', 'Alloprene' and polyvinyl pyrrolidone. Preferred polymeric binders include polymethyl methacrylate or preferably copolymers of methyl methacrylate and lower alkyl having up to 6 carbon atoms, e.g. ethyl and butyl, methacrylates or preferably acrylates, typically in a molar ratio of about 9:1.

Polymeric binders typically provide between 10 and 30% w/w and preferably between 15 and 20% w/w of the polymerisable composition.

The amount of polymeric binder used in polymerisable compositions according to the present invention and the Tg thereof wil be chosen in the light of the conditions under which a three-layer element is prepared from the polymerisable composition as hereinafter described. Use of too much polymeric binder tends to lead to a flaky layer of the polymerisable composition in the three-layer element.

Polymerisable compositions according to the present invention may contain one or more substances which bear one or more polymerisable olefinically unsaturated groups and which is (are) copolymerisable with the at least one aromatic/aldehyde oligomer. Such substances are hereinafter referred to for convenience as "comonomers".

As examples of comonomers which may be present in polymerisable compositions according to the present invention and which contain one polymerisable olefinically unsaturated group may be mentioned readily available monomers selected from the classes including inter alia hydrocarbons, e.g. styrene; ethers, e.g. vinyl ethyl ether; esters, e.g. vinyl acetate, methyl methacrylate, ethyl acrylate, butyl methacrylate and 2-ethylhexyl methacrylate; and amides, e.g. N-vinyl pyrrolidone, and N-alkyl acrylamides.

As examples of comonomers which may be present in polymerisable compositions according to the present invention and which contain a plurality of polymerisable olefinically unsaturated groups may be mentioned polymerisable prepolymers. As examples of such prepolymers may be mentioned vinyl urethanes, for example those described in United Kingdom Patent Specification Nos. 1,352,063, 1,465,097 and 1,498,421 and German Offenlegunsschrift No. 2,419,887; and the reaction products of a diol, particularly a bisphenol, with a glycidyl alkacrylate, for example those described in U.S. Pat. Nos. 3,066,112 and 4,131,729. The disclosure in the aforementioned specifications are incorporated herein by way of reference.

Preferably, however, comonomers, where present in polymerisable compositions according to the present invention, are low viscosity compounds containing a plurality of polymerisable olefinically unsaturated groups. As examples of such compounds may be mentioned (alk)acrylic acid esters of polyhydroxy compounds, for example, diethylene glycol, trimethylolpropane and pentaerythritol, e.g. triethylene glycol dimethacrylate and trimethylolpropane trimethacrylate.

The photoinitiator system for use in the present invention may comprise any of the known photo-initiator systems which are used to initiate polymerisation of polymerisable olefinically unsaturated monomers. As examples of such systems can be mentioned inter alia (a) mixtures of Michler's ketone and benzil or preferably benzophenone, typically in a weight ratio of about 1:4; (b) mixtures of amines and ketones as disclosed in EP No. 90493A, e.g. camphorquinone or fluorenone and N, N-dimethylaminoethyl methacrylate, typically in a weight ratio of about 1:1, (c) the coumarin-based photoinitiator systems described in U.S. Pat. No. 4,289,844, (d) combinations of hexaarylbisimidazoles and leuco dyes, (e) cyclohexadienone-leuco dye systems described in U.S. Pat. No. 4,241,869, or preferably (f) systems based on dimethoxyphenyl-acetophenone (benzil dimethyl ketal) and/or diethoxyacetophenone.

The concentration of the photoinitiator system used in the polymerisable composition of the present invention is typically up to about 10% w/w.

We do not exclude the possibility that polymerisable compositions according to the present invention may contain a peroxy initiator, but this is not preferred.

Optionally polymerisable compositions according to the present invention on exposure to actinic radiation of a wavelength which is absorbed by the photo-initiator system interact therewith such that a contrast between exposed and unexposed regions of the polymerisable composition is generated. For example, where the polymerisable composition is colourless a colour may be generated in the exposed region thereof, or preferably, where the polymerisable composition is coloured, the colour disappears or changes in the exposed region thereof. For the generation of such a contrast, the polymerisable composition preferably contains a light-sensitive system which absorbs the aforesaid actinic radiation. As examples of such light sensitive systems may be mentioned interalia leuco dyes, e.g. crystal violet; fluoran and a compound which generates an acid on exposure to suitable actinic radiation e.g. $Ph_3S^+PF_6^-$; and a combination of a light-fast dye, typically blue in colour, and a light-unstable dye, typically yellow in colour.

Polymerisable compositions according to the present invention may contain a pigment, for example a phthalocyanine green.

Polymerisable compositions according to the present invention typically contain processing aids. As examples of processing aids may be mentioned interalia agents which act as at least one of the following: surfactant, flow modifier or anti-blocking agent. Suitable such agents are well known in the art and include interalia $CF_3(CF_2CF_2)_{17}CH_2CH_2OCO(CH_2)_{16}CH_3$ or preferably a silicone acrylate or more preferably a silicone diacrylate.

Polymerisable compositions according to the present invention may contain a particulate filler, e.g. a silica. It will be appreciated that where a particulate filler is present it does not unduly adversely affect the properties of the polymerisable composition. However, the presence of a particulate filler is not preferred.

Polymerisable compositions according to the present invention typically contain a suitable thermal polymerisation inhibitor. As examples of such inhibitors may be mentioned inter alia p-methoxyphenol, hydroquinone, alkyl- and aryl- substituted hydroquinones and quinones, and t-butyl catechol. Such inhibitors are used in a concentration of up to a few weight % of the polymerisable composition.

In a preferred embodiment of the present invention, the polymerisable composition comprises (a) 55–85% w/w of one or more aromatic/aldehyde oligomers, (b) 10–30% w/w of one or more methacrylate homo- or copolymers, (c) a photo-initiator system for initiating polymerisation of the polymerisble composition, and optionally (d) various additives as hereinbefore defined, the combined weight percentages of components (a), (b), (c) and (d) amounting to 100%.

Conveniently polymerisable compositions according to the present invention are used in the form of a three-layer element in which a layer of the polymerisable composition, preferably in the form of a solid or tack-free layer, is sandwiched between a support film and cover film. However we do not exclude the possibility that a suitable substrate, as hereinafter described, may be coated directly with the polymerisable compositon for example by deposition from a suitable solvent.

As examples of suitable polymers of which support films used in the preparation of permanent dry film resists may be comprised may be mentioned inter alia polyamides, polyolefins, vinyl polymers, cellulose or preferably polyesters, more preferably polyethylene terethphalate. Preferably the support film transmits actinic radiation of a wavelength which is to be used to cure the photopolymerisable composition. Preferably the support film is substantially impermeable to oxygen. The thickness of the support film may be between 5 microns and 200 microns, and typically is between 10 microns and 50 microns.

Cover films used in the preparation of permanent dry film resists may be made from a polymer which has hereinbefore been indicated as suitable for preparation of the support film. Preferably the cover film comprises a polyolefin, and more preferably polyethylene. The thickness of the cover film may be between 5 microns and 200 microns, and typically is between 20 microns and 50 microns.

Where a polymerisable composition of the present invention is used in a three-layer element it is typically in the form of a substantially dry tack-free layer of thickness between 10 and 100 microns.

Whilst the polymerisable composition is preferably applied to the support film as a solution in a suitable solvent and the solvent evaporated off to leave a substantially tack-free solid layer, we do not exclude the possibility that it may be heated and applied in a softened state to the support film. The cover film is then laminated to the solid layer to provide a three-layer element.

As examples of suitable solvents from which the tack-free solid layer may be cast may be mentioned inter alia methyl ethyl ketone, methylene dichloride or preferably 1,1,1-trichloroethane since 1,1,1-trichloroethane tends to improve the clarity of the layer, and solutions of the polymerisable composition therein are more stable than in methyl ethyl ketone.

In use, the cover film is removed from the three-layer element and the exposed surface of the solid layer of polymerisable composition is brought into contact with a suitable base-board and laminated to a surface thereof, for example using resilient heated pressure rolls. To produce a resist image, the polymerisation composition is exposed imagewise, preferably through the support film, to radiation having a wavelength in the range of 250 to 600 nanometers, preferably in the range of 320 nanometers to 500 nanometers; the support film is removed, for example by peeling off; and the resist is developed by washing away the unexposed areas with a suitable washing solvent, to leave a base-board bearing a relief resist image on its surface. The resist image, where it is to be used in a so-called additive process, may be post-cured, for example by heating at a temperature in the range of 120° C. to 250° C., or by UV curing using conventional UV-curing equipment.

The aforesaid suitable washing solvent is conveniently 1,1,1-trichloroethane. However, we do not exclude the possibility that the washing solvent may be chosen in the light of the nature of the polymeric binder. For example, where polyvinyl butyral is present the washing solvent is typically methyl ethyl ketone; where a methyl methacrylate homo- or co-polymer is present the solvent is typically 1,1,1-trichloroethane; and where polyvinyl pyrrolidone is present the solvent is typically cyclohexanone.

It will be appreciated that where the resist is generated on a copperised surface of the base-board the non-protected copper may be removed in a so-called subtractive process. Preferably, however, the resist is used as a permanent or non-strippable resist in a so-called additive process in which a metal, e.g. copper, is deposited on the bare portion of the surface of a suitable substrate, for example a ceramic plate or a conventional base-board used for additive plating, e.g. an epoxy glass composite as used in Kollmorgen PCK Technologies CC-4 additive plating process, between the areas of photoresist, e.g. by electroless plating and then optionally by electrolytic deposition.

It is often preferred that the polymerisable compositions according to the present invention do not contain sulphur or certain sulphur-containing compounds which may have a tendency to affect adversely the plating bath when the resist generated from the polymerisable composition is used in an additive process.

The resists prepared from the polymerisable compositions of the present invention, after post-curing, are often (a) able to withstand sodium hydroxide solution at pH12 and 80° C. for 20 hours; chromic acid at pH1 and 45° C. for 20 minutes; a humidity of 92% at 90° C. for 1 month without distortion and a solder float test at 285° C. for 30 seconds without blistering or loss of adhesion; and (b) are resistant to attack by methylene chloride for 1 minute at ambient temperature with little or no change in surface hardness or appearance.

Accordingly, a further aspect of the present invention provides a process for forming a non-strippable resist on a surface which process comprises the steps of:

(a) applying to a surface a first surface of a solid layer of a polymerisable composition as hereinbefore defined, the second surface of the said layer having adhering thereto a thin flexible polymeric support film, then in either order;

(b) exposing the layer, imagewise, to actinic radiation to form a polymeric image in the layer; and (c) stripping the support films from the layer; then (d) washing away the unexposed areas of the layer to orm a resist image of polymeric material; and (e) post-curing the resist image.

The present invention is further illustrated by reference to the following Examples.

Example 1

This example illustrates the preparation of an aromatic/aldehyde oligomer for use in the present invention.

Paraformaldehyde (25 kilograms) was added to sulphuric acid (specific gravity 1.550; 234.9 kilograms) with stirring in an atmosphere of 5% oxygen in nitrogen at room temperature and the mixture was heated to 65° C. Methacrylic acid (stabilised with 100 ppm hydroquinone and 100 ppm Topanol "0"; 117 liters) was added to the mixture, followed, over a 30 minute period, by the addition of a solution of diphenyl ether (28 liters) in methacrylic acid (25 liters) while the reaction temperature was maintained at 64°–67° C. The reaction mixture was stirred at 64°–67° C. for 3 hours and then allowed to stand for 15 minutes.

Phase separation occurred and the upper organic layer was recovered, sodium nitrite (100 ppm based on methacrylic acid) was added, and it was washed with water (150 liters X2) at 60° C. On standing it separated into a lower oligomeric phase and an upper methacrylic acid phase.

The oligomeric phase was cooled to about 30° C., was washed with 50% v/v aqueous methanol, and was dissolved in methylene chloride (80 liters). The solution was analysed for residual acid content and a 10% excess of 10% aqueous ammonia was slowly added to the solution. An emulsion formed which was broken by the addition of methanol (50 liters) and by standing overnight.

The lower layer from the broken emulsion was passed though a 5A molecular sieve column. The methylene chloride was evaporated off to leave an aromatic-/aldehyde oligomer (46 kilograms), $M_n$=972; $M_w$=2144; acid value, 13 mgs KOH/gram; saponification value 219 mgs KOH/gram; hydroxyl value, 31 mgs KOH/gram; functionality, 3.57; ratio of para-para linkages to ortho-para linkages of 4.3 : 1.

Examples 2–13

General Procedure

These examples illustrate the preparation of solid tack-free layers comprising polymerisable compositions according to the present invention.

A solution of aromatic/aldehyde oligomer, polymeric binder, photoinitiator system and, where indicated, a comonomer, a dyestuff, a pigment, a stabiliser, and an antiblocking agent in a suitable solvent was coated onto a Melinex (RTM) polyester support film. In Examples 2–8, the support film was 70 microns thick; in Examples 9–13, the support film was 23 microns thick. In Examples 2–9, a 100 micron wet film thickness coiled wire coating bar was used; in Examples 10–13, , a 125 micron wet film thickness coiled wired coating bar was used. The wet film was dried with a hot air blower and was then allowed to stand at room temperature for 2 hours; a tack-free solid layer of a polymerisable composition of thickness about 35 microns supported on a polyester support film was obtained.

The composition (% w/w) of the tack-free solid layers and the solvents from which they were deposited are shown in Table 1. In addition to the weight percentages shown in Table 1, there were present in Example 9, 0.7% w/w Topanol "0" (RTM) and 0.1% w/w of a silicone acrylate (Ebecryl 350 (RTM)); in Examples 10 to 13, 0.2% of the aforementioned silicone acrylate and 10 ppm of a defoaming agent (Silcolapse 430 (RTM)); and in Examples 12 and 13, 10 ppm, benzoquinone.

In Examples 2–8, a polyethylene cover film was laminated to the bare surface of the tack-free solid layer using a hot-roll laminator at 60° C. to form a three-layer element. In Example 9, a polyethylene cover film was laminated to the bare surface of the tack-free layer using a pilot coater nip roller at room temperature.

TABLE 1

| Ex. No | Aromatic/aldehyde oligomers | Polymeric binder | Co-monomer | Photo initiator system | Duestuff (Waxoline Green) | Pigment (Monastral Green) | Solvent |
|---|---|---|---|---|---|---|---|
| 2 | A: 66.6 | X: 28.5 | — | L: 4.8 | 0.1 | — | P |
| 3 | A: 66.6 | X: 28.5 | — | M: 1.0 N: 3.8 | 0.1 | — | P |
| 4 | A: 65.4 | X: 28.0 | — | L: 4.7 O: 1.8 | 0.1 | — | P |
| 5 | A: 60.8 | X: 26.1 | Z: 8.7 | L: 4.3 | 0.1 | — | P |
| 6 | C: 47.6 | X: 28.6 | Z: 19.0 | L: 4.8 | — | — | P |
| 7 | C: 57.1 | Y: 28.6 | Z: 9.5 | L: 4.7 | 0.1 | — | P |
| 8 | A: 57.0 | X: 28.5 | F: 9.5 | M: 1.0 N: 3.8 | 0.2 | — | P |
| 9 | D: 72.2 | X: 13.5 W: 4.5 | — | L: 6.4 J: 1.8 K: 0.5 | — | 0.3 | P |
| 10 | E: 72.3 | X: 18.1 | — | I: 4.5 L: 4.5 | — | 0.04 | Q |
| 11 | E: 72.3 | X: 18.1 | — | I: 4.5 L: 4.5 | — | 0.04 | R |
| 12 | E: 72:3 | X: 18.1 | — | I: 4.5 L: 4.5 | — | 0.04 | P |
| 13 | E: 72.3 | X: 18.1 | — | I: 2.7 L: 6.3 | — | 0.04 | P |

Symbols used in Table 1
A: An aromatic/aldehyde oligomer prepared as described in Example 70 of EPA 83307128.5.
B: An aromatic/aldehyde oligomer prepared as described in Example 84 of EPA 8330728.5.
C: An aromatic/aldehyde oligomer as described in EPA 83307128.5 of $M_n$ = 920 and functionality 3.9.
D: An aromatic/aldehyde oligomer as described in EPA 83307128.5 of $M_n$ = 800 and functionality 3.0.
E: An aromatic/aldehyde oligomer as prepared in Example 1.
F: A vinyl urethane prepared as described in Example 1 of European Patent Publication No. 64809A except that methyl ethyl ketone was used as the reaction solvent.
I: Diethoxyacetophenone.
J: Ethyl 4-dimethylaminobenzoate (Quantacure EPD (RTM)).
K: t-Butylanthraquinone.
L: 2,2-Dimethoxy-2-phenylacetophenone (Irgacure 651).
M: Michler's Ketone.
N: Benzophenone.
O: N,N—dimethyl-2-aminoethyl methacrylate
P: Methyl ethyl ketone (45% w/w of solution).
Q: 1,1,1-Trichloroethane (Genklene (RTM); 58% w/w of solution).
R: Genklene (RTM)/methylene chloride mixture in volume ratio 58.5:41.5 (58% w/w of solution).
W: A methyl methacrylate polymer of $M_n$ = 26,500 and $M_w$ = 72,200 (Acryloid (RTM) B44).
X: A copolymer of methylmethacrylate and butyl acrylate, in weight ratio 9:1, $M_n$ = 43200 and $M_w$ = 65000.
Y: Polymethylmethacrylate $M_n$ = 12000.
Z: Triethyleneglycol dimethacrylate.

The cover films in Example 2–9 were removed, easily, from the three-layer element when required.

The tack-free solid layer obtained in Example 10 was clear, in Example 11 it was cloudy and in Examples 12 and 13 it was almost clear.

Examples 14–19

These examples illustrate the production of permanent dry film resists by the process of the present invention.

The bare surfaces of portions of the tack-free layers prepared in Examples 2–13 were, after a first storage at room temperature for a defined length of time, contacted with the surface of a conventional board as used in the Kollmorgen PCK Technologies CC-4 "additive" process (which had been scrubbed under water with Scotchbrite (RTM)) and was laminated thereto using a Dynachem (RTM) Model 300 Laminator at 105° C. and a through speed of 1 foot per minute in Examples 14–20; at 105° C. and 1.5 feet per minute in Example 21; and 100° C. and 3 feet per minute in Examples 22–29 to form a laminate which comprised a board, a tack-free layer and a support film.

The laminate was allowed to cool for 30 minutes, and was then exposed, through a Stouffer 21-step sensitivity guide disposed on the Melinex (RTM) film, to UV radiation (Parker Graphics Ltd, "Countess" exposure unit provided with two MLU 300 w Philips UV lamps) for a certain period of time.

After the exposure the resists were stored for a certain time, the Melinex (RTM) film was removed and the tack-free layer was washed with 1,1,1-trichloroethane for a certain time; a cured resin which was resistant to washing was obtained at steps up to and including the steps indicated by the step wedge numbers shown in Table 2.

TABLE 2

| Ex. No. | Solid layer Prepared in Example No | First Storage Time (hours) | Exposure Time (minutes) | Second Storage Time (minutes) | Washing Time (minutes) | Step Wedge No |
|---|---|---|---|---|---|---|
| 14 | 2 | 0.5 | 5 | 30 | 2 | 7 |
| 15 | 3 | 0.5 | 5 | 30 | 2 | 7 |
| 16 | 4 | 0.5 | 5 | 30 | 2 | 7 |
| 17 | 5 | 0.5 | 5 | 30 | 2 | 4 |
| 18 | 6 | 0.5 | 7 | 30 | 2 | 11 |
| 19 | 7 | 0.5 | 8 | 30 | 2 | 10 |
| 20 | 8 | 0.5 | 5 | 30 | 2 | 7 |
| 21 | 9 | 0.5 | 4 | 20 | 1 | 11 |
| 22 | 10 | 4 | 3 | 5 | 1 | 11 |
| 23 | 10 | 288 | 3 | 5 | 1 | 11 |
| 24 | 11 | 4 | 3 | 5 | 1 | 11 |
| 25 | 11 | 288 | 3 | 5 | 1 | 11 |
| 26 | 12 | 4 | 3 | 5 | 1 | 8 |
| 27 | 12 | 288 | 3 | 5 | 1 | 8 |
| 28 | 13 | 4 | 3 | 5 | 1 | 10 |
| 29 | 13 | 288 | 3 | 5 | 1 | a | a: Not determined.

Examples 14 to 29 were repeated except that a Stouffer step wedge was not used, that after removal of the Melinex (RTM) film the washing step was omitted and the cured layer was post-cured by exposure for 4 hours (Examples 14–21) or 1 hour (Examples 22–29) to a Philips HPR 125w mercury discharge reprographic lamp at a distance of 40 centimeters.

The post-cured layer was unaffected by 3 drops of methylene chloride disposed on its surface for 1 minute.

The board and post-cured layer were dipped in Multicore Rosin Foam Flux PC26. After the flux-treatment a first portion was placed, resist surface down, for 30 seconds on a 60:40 tin-lead solder bath at 285° C.; a second portion was placed, resist surface down, on the solder bath for 6 seconds, removed for 21 seconds and contacted for a further 6 seconds. Both portions were cleaned with 1,1,1-trichloroethane and the resist was found to be neither dulled nor blistered. A 2 mm crosshatch pattern was produced on both portions, pieces of 3M Scotch (RTM) 610 tape were pressed firmly against the surface of both resists and removed with a sharp tug. Less than 5% of the resist was removed from the board.

Examples 14–21 were repeated except that the laminate was exposed, for 4 minutes, through a standard photo-tool, having 170 micron lines and spaces, disposed on the Melinex (RTM) film. Twenty minutes after the end of exposure, the Melinex (RTM) film was removed and the solid layer was washed with 1,1,1-trichloroethane for 1 minute; a resist pattern consisting of approximately 170 micron lines and spaces was thereby produced.

I claim:

1. A polymerisable composition consisting essentially of
   (a) at least one polymerisable olefinically unsaturated oligomer which
      (i) may be linear or branched,
      (ii) is derived from one or more aromatic compounds and one or more aldehydes,
      (iii) has a backbone which consists essentially of repeat units—$(Ar^1\text{—}CHR^1)$ wherein $Ar^1$, each of which may be the same or different, is an aromatic group, or a suitable substituted derivative thereof, and $R^1$, each of which may be the same or different, is a hydrogen atom or a hydrocarbyl group,
      (iv) has pendant and/or terminal acyloxymethyl groups attached to the oligomer backbone in which the acyl group is derived from an olefinically unsaturated carboxylic acid,
      (v) has a functionality of between 2 and 6, and
      (vi) has a number average molecular weight of between 900 to 1100 and a weight average molecular weight of between 1900 and 2500;
   (b) one or more polymeric binders each of which has a molecular weight of between 10,000 and 1,000,000; and
   (c) a photoinitiator system for initiating polymerisation of the said at least one polymerisable olefinically unsaturated oligomer.

2. A polymerisable composition as claimed in claim 1 wherein the aromatic groups in the said at least one polymerisable olefinically unsaturated oligomer have the structure —$\phi$—$Y^1$—$\phi$— wherein $\phi$ is the phenylene group and Y is a direct link between two phenylene groups, or a divalent residue which contains one or more in-chain atoms each of which atoms may be carbon or a hetero atoms and may have one or more atoms appendant thereto.

3. A polymerisable composition as claimed in claim 2 wherein $Y^1$ is oxygen.

4. A polymerisable composition as claimed in claim 1 wherein the aldehyde from which the said at least one polymerisable olefinically unsaturated oligomer is derived is formaldehyde.

5. A polymerisable composition as claimed in claim 1 wherein the polymeric binder is a homo- or co-polymer of methyl methacrylate.

6. A polymerisable composition as claimed in claim 1 wherein the photo-initiator system is based on dimethoxyphenyl-acetophenone and/or diethoxy-acetophenone.

7. A polymerisable composition as claimed in claim 1 which comprises (a) 55-85% w/w of the said at least one polymerisable olefinically unsaturated oligomer, (b) 10-30% w/w of one or more methyl methacrylate homo- or co-polymers and (c) a photo-initiator system.

8. A polymerisable composition as claimed in claim 7 which includes a pigment.

9. A polymerisable composition as claimed in claim 7 which includes a processing aid.

10. A polymerisable composition as claimed in claim 7 which includes a particulate filler.

11. A polymerisable composition as claimed in claim 7 which includes a thermal polymerisation inhibitor.

* * * * *